US009362963B2

(12) United States Patent
Nagai et al.

(10) Patent No.: US 9,362,963 B2
(45) Date of Patent: Jun. 7, 2016

(54) RADIO-FREQUENCY SIGNAL RECEPTION CIRCUIT AND ISOLATED SIGNAL TRANSMISSION APPARATUS

(71) Applicant: Panasonic Intellectual Property Management Co., Ltd., Osaka (JP)

(72) Inventors: Shuichi Nagai, Osaka (JP); Yasufumi Kawai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/686,821

(22) Filed: Apr. 15, 2015

(65) Prior Publication Data
US 2015/0222306 A1 Aug. 6, 2015

Related U.S. Application Data

(63) Continuation of application No. PCT/JP2014/003488, filed on Jul. 1, 2014.

(30) Foreign Application Priority Data

Jul. 30, 2013 (JP) .................................. 2013-158356

(51) Int. Cl.
| | | |
|---|---|---|
| H04B 1/04 | (2006.01) | |
| H04B 1/10 | (2006.01) | |
| H03K 17/0412 | (2006.01) | |
| H03K 17/691 | (2006.01) | |
| H04B 1/44 | (2006.01) | |

(52) U.S. Cl.
CPC .......... *H04B 1/1018* (2013.01); *H03K 17/0412* (2013.01); *H03K 17/691* (2013.01); *H04B 1/44* (2013.01)

(58) Field of Classification Search
CPC .......... H04B 1/06; H04B 1/16; H03K 17/041; H03K 17/687; H03K 17/04106
USPC .......... 455/102, 130, 191.3, 193.2, 332, 333; 327/109, 374, 376–377, 379, 383–384
See application file for complete search history.

(56) References Cited

U.S. PATENT DOCUMENTS

| | | | | |
|---|---|---|---|---|
| 7,551,028 B1 * | 6/2009 | Cyrusian | ................. | H03F 3/217 330/10 |
| 8,866,516 B2 | 10/2014 | Nagai et al. | | |
| 2004/0066179 A1 * | 4/2004 | Wu | ........................ | H02J 9/062 323/222 |
| 2005/0243580 A1 * | 11/2005 | Lyle | .................. | H02M 7/53806 363/16 |

FOREIGN PATENT DOCUMENTS

| | | |
|---|---|---|
| JP | 2008-067012 | 3/2008 |
| WO | 2013/065254 | 5/2013 |

OTHER PUBLICATIONS

International Search Report of PCT application No. PCT/JP2014/003488 dated Sep. 22, 2014.

* cited by examiner

*Primary Examiner* — Tuan Pham
(74) *Attorney, Agent, or Firm* — McDermott Will & Emery LLP

(57) ABSTRACT

A radio-frequency signal reception circuit that detects an input signal includes an input reference terminal, a first input terminal into which a first input signal is input, a second input terminal into which a second input signal is input, an output terminal and output reference terminal from which an output signal is output, a first detector circuit that detects the first input signal and outputs a first output signal, which is a positive-voltage pulse signal, to the output terminal, a second detector circuit that detects the second input signal and outputs a second output signal, which is a positive-voltage pulse signal, to the output reference terminal, and a transistor connected to the input reference terminal and output reference terminal. The input signal includes the first input signal and second input signal. The output signal includes the first output signal and second output signal.

9 Claims, 5 Drawing Sheets

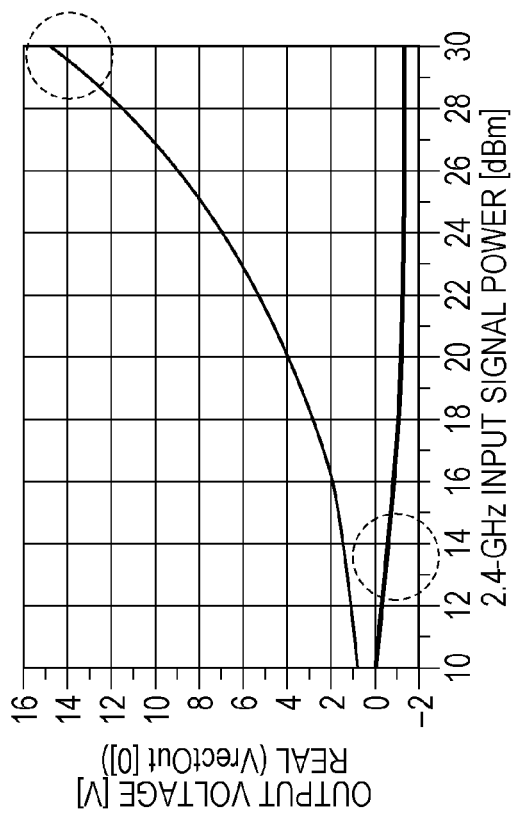
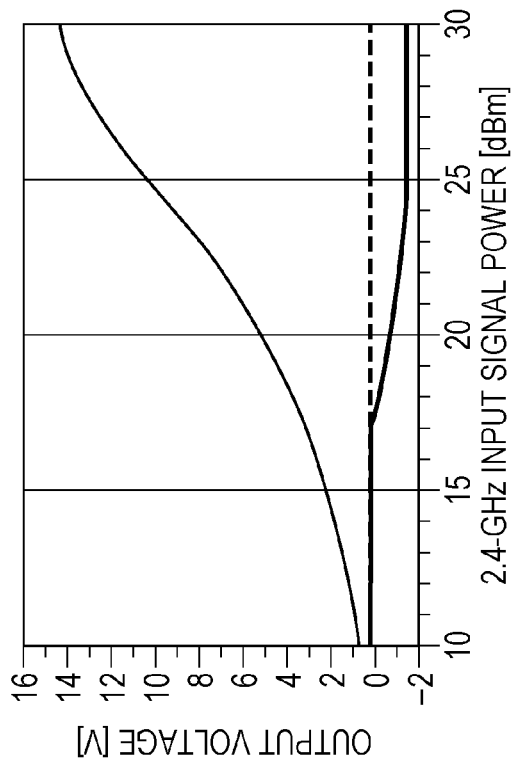

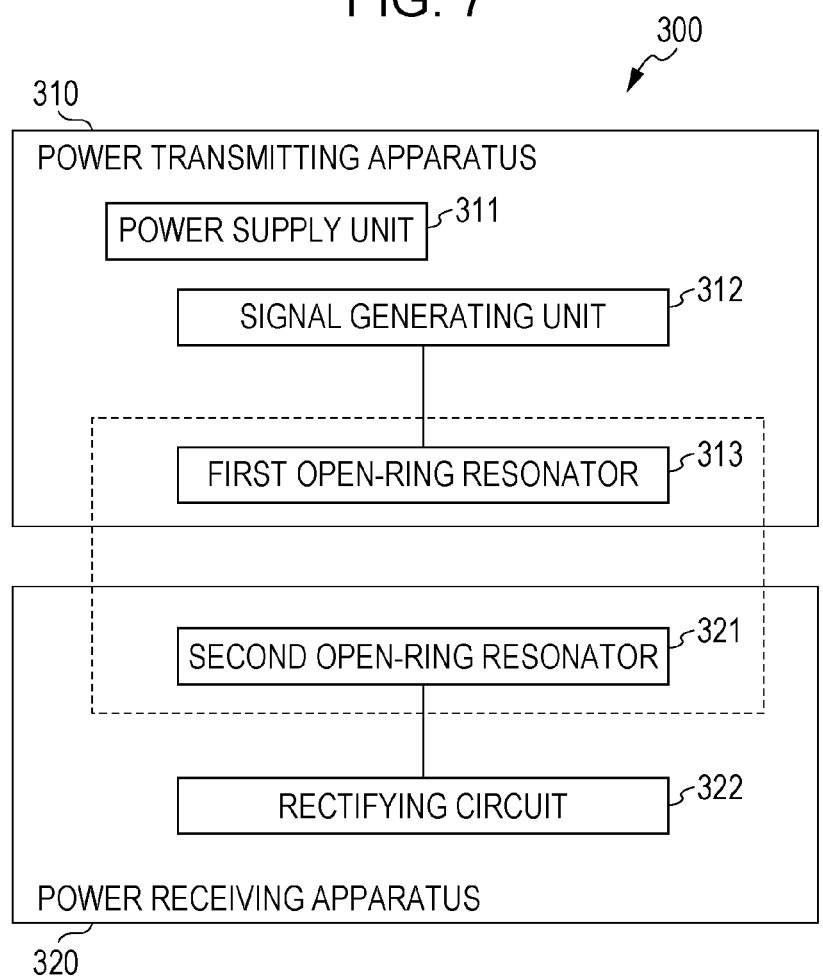

RADIO-FREQUENCY SIGNAL RECEPTION CIRCUIT AND ISOLATED SIGNAL TRANSMISSION APPARATUS

BACKGROUND

1. Technical Field

The present disclosure relates to a radio-frequency signal reception circuit used as, for example, a gate drive circuit that drives the gate of a semiconductor switch and to an isolated signal transmission apparatus.

2. Description of the Related Art

A gate drive circuit for a semiconductor switching element (also referred to simply as a switching element) is a circuit that drives a semiconductor switching element. The gate drive circuit applies a gate voltage to the gate terminal of the semiconductor switching element to control its on and off states. A high-voltage switching element is, for example, an insulated gate bipolar transistor (IGBT), which is a type of power semiconductor device. A typical gate drive circuit includes a P-type transistor and an N-type transistor at the output part. The switching element is to be switched from the off state to the on state when the P-type transistor is operated. The switching element is to be switched from the on state to the off state when the N-type transistor is operated. When the switching element is to be switched from the on state to the off state, a gate current is drawn from the switching element.

In the gate drive circuit, a reference voltage on the output side connected to a semiconductor switching element is very high. Accordingly, a direct-current component needs to be isolated between a primary side, through which a control signal is input into the gate drive circuit, and a secondary side, from which a driving signal is output to the semiconductor switching element. In other words, signal ground needs to be isolated between the primary side and the secondary side. An electronic circuit element that can isolate a direct-current component between the primary side and secondary side of the gate drive circuit is referred to as a signal isolator or a non-contact signal transmitter. Signal isolators and non-contact signal transmitters are essential to the driving of switching elements. The electronic circuit element isolates logic ground and radio-frequency (RF) ground from each other. For example, an isolated power supply unit provided with the gate drive circuit may cause a circuit size thereof to be increased. If the gate drive circuit includes a transmitter that can isolatedly transmit not only a gate signal but also a driving power from the primary side to the secondary side, the isolated power supply unit becomes unnecessary, enabling the gate drive circuit to be made compact.

Japanese Unexamined Patent Application Publication No. 2008-067012 discloses an electric power transmission system in which an open-ring electromagnetic resonant coupler is used as a non-contact signal transmitter.

SUMMARY

In a conventional radio-frequency signal reception circuit, it has been desirable to output a signal at high speed.

One non-restricting and exemplary embodiment provides a radio-frequency signal reception circuit and isolated signal transmission apparatus that can output a signal at high speed.

A radio-frequency signal reception circuit according to one aspect of the present disclosure includes: a first input terminal into which a first input signal is input, the first input signal including a first modulated radio-frequency signal; a second input terminal into which a second input signal is input, the second input signal including a second modulated high frequency signal; an input reference terminal to which a reference potential of the first and second input signals is applied; an output terminal from which a first output signal is output; an output reference terminal from which a second output signal is output; a first detector circuit that detects the first input signal and outputs the first output signal to the output terminal, the first output signal including a first positive-voltage pulse based on the reference potential; a second detector circuit that detects the second input signal and outputs the second output signal to the output reference terminal, the second output signal including a second positive-voltage pulse based on the reference potential; and a transistor that includes a first terminal, a second terminal, and a control terminal, the first terminal and control terminal being connected to the input reference terminal, the second terminal being connected to the output reference terminal.

The present disclosure can also be implemented as an isolated signal transmission apparatus that includes the radio-frequency signal reception circuit in the one aspect of the present disclosure.

According to the radio-frequency signal reception circuit and isolated signal transmission apparatus according to the present disclosure, a signal can be output at high speed.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIGS. 6A and 6B illustrate an example of output voltage with respect to input signal intensity in the radio-frequency signal reception circuit according to the second embodiment of the present disclosure; and FIG. 7 is a block diagram illustrating the structure of a conventional electric power transmitting apparatus.

DETAILED DESCRIPTION

Figure 1:
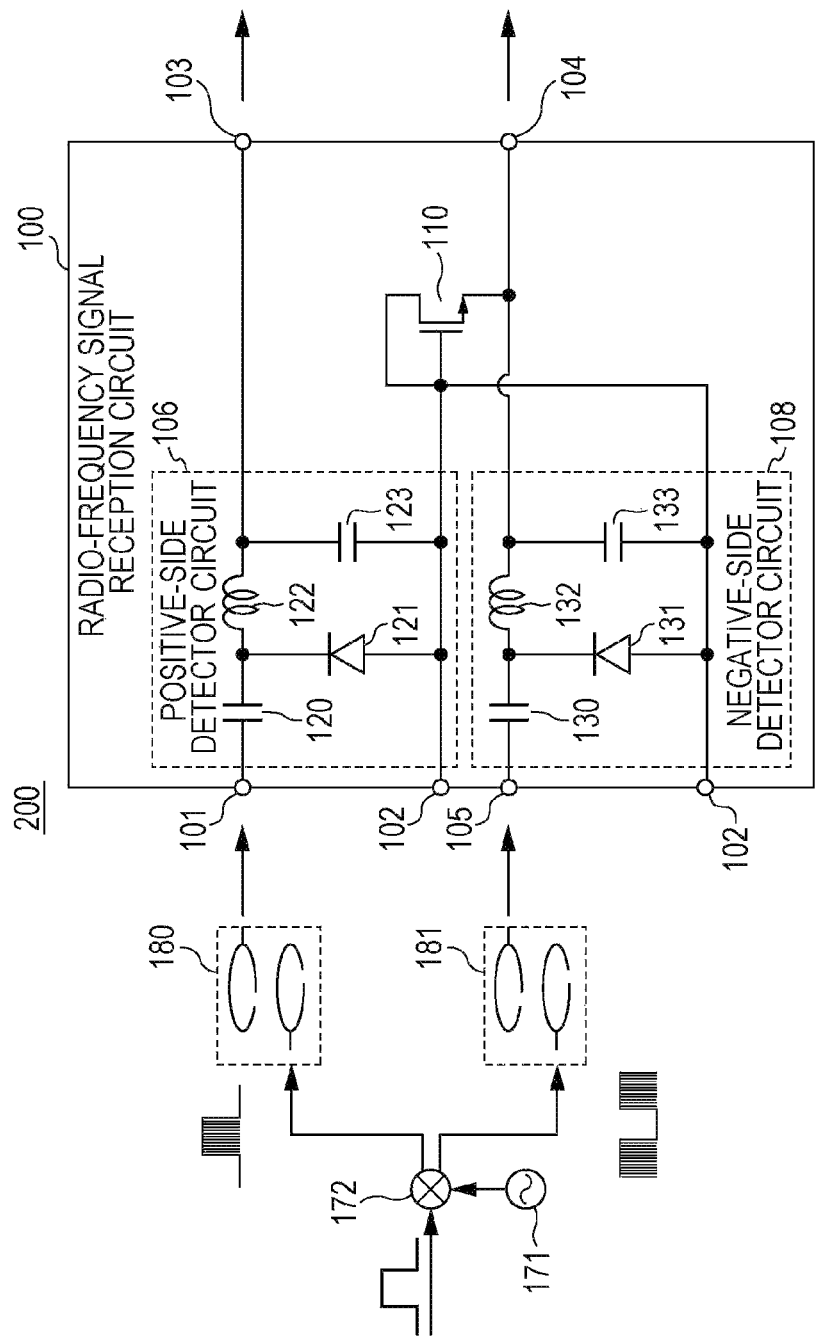
FIG. 1 illustrates an example of an isolated signal transmission apparatus according to a first embodiment of the present disclosure.

Underlying Knowledge Forming Basis of the Present Disclosure

The inventor found that the conventional technology has problems described below.

FIG. 7 is a block diagram illustrating the structure of an electric power transmitting apparatus 300 disclosed in Japanese Unexamined Patent Application Publication No. 2008-

067012. The electric power transmitting apparatus 300 has a power transmitting apparatus 310 and a power receiving apparatus 320. The power transmitting apparatus 310 includes a power supply unit 311, a signal generating unit 312 and a first open-ring resonator 313. The power receiving apparatus 320 includes a second open-ring resonator 321 and a rectifying circuit 322.

This type of conventional electric power transmitting apparatus has the problem that a semiconductor switching element cannot be driven at high speed.

It is desirable that an electric power transmission apparatus can not only supply enough electric power to maintain the on state of a semiconductor switching element but also turn off the semiconductor switching element at high speed. The conventional electric power transmitting apparatus can supply a gate current to a semiconductor switching element, but cannot actively draw charges accumulated at the gate of the semiconductor switching element. That is, the conventional electric power transmitting apparatus cannot actively turn off the semiconductor switching element. Therefore, the conventional electric power transfer apparatus cannot turn off the semiconductor switching element at high speed. The reason for this is that the non-contact signal transmitter, such as an electromagnetic resonant coupler, included in the conventional electric power transmitting apparatus only passively transmits electric power. If an electric power transmission apparatus can supply a negative voltage to the gate of a semiconductor switching element, the electric power transmission apparatus can turn off the semiconductor switching element at high speed. In this case, however, it is necessary to provide a separate circuit, a separate signal isolator, and the like to supply a negative voltage.

In view of the situation described above, the present disclosure provides a radio-frequency signal reception circuit and an isolated signal transmission apparatus that can generate an output signal in which not only a rising time but also a fall time are short. If the radio-frequency signal reception circuit and isolated signal transmission apparatus are applied to, for example, a gate drive circuit, a driving signal with a shirt rising time and falling time can be output to a semiconductor switching element to be driven. In addition, a larger voltage can be output when compared with conventional radio-frequency signal reception circuits and isolated signal transmission apparatuses. The radio-frequency signal reception circuit in the present disclosure can also be applied to other than gate drive circuits.

Overview of Embodiments

A radio-frequency signal reception circuit according to a first aspect of the present disclosure detects an input signal, which is obtained by modulating a carrier with a pulse signal. The input signal includes a first input signal and a second input signal. The radio-frequency signal reception circuit includes an input reference terminal to which the reference potential of the input signal is applied, a first input terminal into which the first input signal is input, a second input terminal into which the second input signal is input, an output terminal and an output reference terminal from which an output signal is output, a first detector circuit that detects the first input signal and outputs a first output signal to the output terminal, a second detector circuit that detects the second input signal and outputs a second output signal to the output reference terminal, and a transistor. The first output signal is a positive-voltage pulse based on a potential of the input reference terminal, and the second output signal is a positive-voltage pulse based on the potential of the input reference terminal. The transistor includes a first terminal, a second terminal, and a control terminal. The first terminal and control terminal is connected to the input reference terminal, and the second terminal is connected to the output reference terminal.

When a voltage is output from the second detector circuit to the output reference terminal on the basis of the potential of the input reference terminal, the voltage is applied to the second terminal of the transistor on the basis of the potential of the first terminal and control terminal thereof, thereby switching conduction and non-conduction between the input reference terminal and the output reference terminal. This allows the radio-frequency signal reception circuit to selectively apply a positive-voltage pulse and a negative-voltage pulse to the output terminal. Therefore, when a power semiconductor switching element, for example, is connected to the radio-frequency signal reception circuit, the power semiconductor switching element can be switched at high speed from the on state to the off state or from the off state to the on state. If, for example, the intensity of the second input signal is large, an output signal with a large negative voltage can be output.

In the radio-frequency signal reception circuit according to the first aspect of the present disclosure, for example, the first input signal may indicate a first amplitude in a first period and a second amplitude in a second period, which differs from the first period. The second input signal may indicate a third amplitude in a third period and a fourth amplitude in a fourth period, which differs from the third period. The second amplitude may be smaller than the first amplitude, and the fourth amplitude may be smaller than the third amplitude. The first detector circuit may output the first output signal to the output terminal by outputting a first voltage, a positive voltage, to the output terminal when the first input signal indicates the first amplitude and by outputting a reference voltage to the output terminal when the first input signal indicates the second amplitude. The second detector circuit may output the second output signal to the output reference terminal by outputting a second voltage, a positive voltage, to the output reference terminal when the second input signal indicates the third amplitude and by outputting the reference voltage to the output reference terminal when the second input signal indicates the fourth amplitude. The first voltage, the second voltage and the reference voltage may be based on the potential of the input reference terminal.

In the radio-frequency signal reception circuit according to the first aspect of the present disclosure, for example, a period other than the first period in the first input signal may be the second period, and a period other than the third period in the second input signal may be the fourth period. When the first detector circuit outputs the first voltage to the output terminal, the second detector circuit may output the reference voltage to the output reference terminal. When the first detector circuit outputs the reference voltage to the output terminal, the second detector circuit may output the second voltage to the output reference terminal. If the first input signal and second input signal are complementary to each other, the second detector circuit does not perform an output operation when the first detector circuit performs an output operation, and the second detector circuit performs an output operation when the first detector circuit does not perform an output operation. Thus, the radio-frequency signal reception circuit can efficiently output a positive voltage and a negative voltage.

In the radio-frequency signal reception circuit according to the first aspect of the present disclosure, for example, the output signal may include a voltage that has a polarity that causes the output terminal to be positive based on the potential of the reference terminal and also has the same absolute value as the first voltage, and a voltage that has a polarity that causes the output terminal to be negative based on the potential of the reference terminal and also has the same absolute value as the second voltage.

In the radio-frequency signal reception circuit according to the first aspect of the present disclosure, for example, the transistor may be turned on while the second detector circuit outputs the reference voltage to the output reference terminal, and may be turned off while the second detector circuit outputs the second voltage to the output reference terminal.

In the radio-frequency signal reception circuit according to the first aspect of the present disclosure, the transistor may be, for example, a normally-on transistor.

In the radio-frequency signal reception circuit according to the first aspect of the present disclosure: for example, the first detector circuit may include a first coupling capacitor, one end of which is connected to the first input terminal, a first diode, the cathode of which is connected to the other end of the first coupling capacitor and the anode of which is connected to the input reference terminal, a first inductor, one end of which is connected to the other end of the first coupling capacitor, and a first smoothing capacitor connected between the other end of the first inductor and the input reference terminal; and the second detector circuit may include a second coupling capacitor, one end of which is connected to the second input terminal, a second diode, the cathode of which is connected to the other end of the second coupling capacitor and the anode of which is connected to the input reference terminal, a second inductor, one end of which is connected to the other end of the second coupling capacitor, and a second smoothing capacitor connected between the other end of the second inductor and the input reference terminal.

Thus, the first detector circuit and second detector circuit can detect a signal with a simple demodulator circuit including a diode and an inductor.

A radio-frequency signal reception circuit according to a second aspect of the present disclosure is a radio-frequency signal reception circuit that detects an input signal, which is obtained by modulating a carrier with a pulse signal including a first input signal and a second input signal. The radio-frequency signal reception circuit includes an input reference terminal to which the reference potential of the input signal is applied, a first input terminal into which the first input signal is input, a second input terminal into which the second input signal is input, an output reference terminal connected to the input reference terminal, an output terminal that is used to output an output signal, a first detector circuit that detects the first input signal and outputs a first output signal to the output terminal, a transistor and a second detector circuit that detects the second input signal and outputs a second output signal to a second terminal of the transistor. The first output signal is a positive-voltage pulse based on a potential of the input reference terminal. The second output signal is a negative-voltage pulse based on the potential of the input reference terminal. The transistor includes a first terminal connected to the output terminal and a control terminal connected to the output reference terminal. The output signal includes the first output signal and second output signal.

When a voltage is output from the second detector circuit to the second terminal of the transistor on the basis of the potential of the input reference terminal, the voltage is applied to the second terminal of the transistor on the basis of the potential of the control terminal thereof, thereby switching conduction and non-conduction between an output part of the negative-side detector circuit and the output terminal. This allows the radio-frequency signal reception circuit to selectively apply a positive-voltage pulse and a negative-voltage pulse to the output terminal. Therefore, when a power semiconductor switching element, for example, is connected to the radio-frequency signal reception circuit, the power semiconductor switching element can be switched at high speed from the on state to the off state or from the off state to the on state. If, for example, the intensity of the second input signal is large, an output signal with a large negative voltage can be output.

In the radio-frequency signal reception circuit according to the second aspect of the present disclosure, for example, the first input signal may indicate a first amplitude in a first period and a second amplitude in a second period, which differs from the first period. The second input signal may indicate a third amplitude in a third period, which differs from the first period, and a fourth amplitude in a fourth period, which differs from the third period. The second amplitude may be smaller than the first amplitude, and the fourth amplitude may be smaller than the third amplitude. The first detector circuit may output the first output signal to the output terminal by outputting a first voltage, a positive voltage, to the output terminal when the first input signal indicates the first amplitude and by outputting a reference voltage to the output terminal when the first input signal indicates the second amplitude. The second detector circuit may output the second output signal to the second terminal of the transistor by outputting a second voltage, a negative voltage, to the second terminal of the transistor when the second input signal indicates the third amplitude and by outputting the reference voltage to the second terminal of the transistor when the second input signal indicates the fourth amplitude. The first voltage, the second voltage and the reference voltage may be based on the potential of the input reference terminal.

In the radio-frequency signal reception circuit according to the second aspect of the present disclosure, for example, a period other than the first period in the first input signal may be the second period, and a period other than the third period in the second input signal may be the fourth period. When the first detector circuit outputs the first voltage to the output terminal, the second detector circuit may output the reference voltage to the second terminal of the transistor. When the first detector circuit outputs the reference voltage to the output terminal, the second detector circuit may output the second voltage to the second terminal of the transistor. If the first input signal and second input signal are complementary to each other, the second detector circuit does not perform an output operation when the first detector circuit performs an output operation, and the second detector circuit performs an output operation when the first detector circuit does not perform an output operation. Thus, the radio-frequency signal reception circuit can efficiently output a positive voltage and a negative voltage.

In the radio-frequency signal reception circuit according to the second aspect of the present disclosure, for example, the output signal may include a voltage that has a polarity that causes the output terminal to be positive based on the potential of the reference terminal and also has the same absolute value as the first voltage, and a voltage that has a polarity that causes the output terminal to be negative based on the potential of the reference terminal and also has the same absolute value as the second voltage.

In the radio-frequency signal reception circuit according to the second aspect of the present disclosure, for example, the transistor may be turned on while the second detector circuit outputs the second voltage to the second terminal of the transistor and may be turned off while the second detector circuit outputs the reference voltage to the second terminal of the transistor.

In the radio-frequency signal reception circuit according to the second aspect of the present disclosure, the transistor may be, for example, a normally-off transistor.

In the radio-frequency signal reception circuit according to the second aspect of the present disclosure: for example, the first detector circuit may include a first coupling capacitor, one end of which is connected to the first input terminal, a first diode, the cathode of which is connected to the other end of the first coupling capacitor and the anode of which is connected to the input reference terminal, a first inductor, one end of which is connected to the other end of the first coupling capacitor, and a first smoothing capacitor connected between the other end of the first inductor and the input reference terminal; and the second detector circuit may include a second coupling capacitor, one end of which is connected to the second input terminal, a second diode, the anode of which is connected to the other end of the second coupling capacitor and the cathode of which is connected to the input reference terminal, a second inductor, one end of which is connected to the other end of the second coupling capacitor, and a second smoothing capacitor connected between the other end of the second inductor and the input reference terminal.

Thus, the first detector circuit and second detector circuit can detect a signal with a simple demodulator circuit including a diode and an inductor.

An isolated signal transmission apparatus according to an aspect of the present disclosure is an isolated signal transmission apparatus that isolatedly transmits a pulse signal. The isolated signal transmission apparatus includes an oscillator that generates a carrier, a modulator that modulates the carrier generated by the oscillator with the pulse signal to generate a first modulated signal and a second modulated signal, a first electromagnetic resonant coupler that isolatedly transmits the first modulated signal, generated by the modulator, with electromagnetic resonance, a second electromagnetic resonant coupler that isolatedly transmits the second modulated signal, generated by the modulator, with electromagnetic resonance, and the radio-frequency signal reception circuit according to the first aspect or second aspect described above. The first modulated signal indicates a first amplitude in a first period and a second amplitude, which is smaller than the first amplitude, in a second period, which differs from the first period. The second modulated signal indicates a third amplitude in a third period, which differs from the first period, and a fourth amplitude, which is smaller than the third amplitude, in a fourth period, which differs from the third period. The radio-frequency signal reception circuit detects an input signal that includes the signal output from the first electromagnetic resonant coupler as a first input signal and also includes the signal output from the second electromagnetic resonant coupler as a second input signal.

Thus, since the isolated signal transmission apparatus includes the radio-frequency signal reception circuit described above, the isolated signal transmission apparatus has the same effect the radio-frequency signal reception circuit.

Embodiments of the present disclosure will be described below in detail with reference to the drawings. The embodiments described below are only specific examples of the present disclosure. Numerals, shapes, materials, constituent elements, placement positions and connection forms of these constituent elements, steps, the sequence of these steps, and the like are only examples, and are not intended to restrict the present disclosure. The present disclosure is identified by claims. Of the constituent elements in the embodiments below, constituent elements not described in independent claims, each of which indicates the topmost concept of the present disclosure, will be described as forming an arbitrary structure.

First Embodiment

FIG. 1 illustrates an example of an isolated signal transmission apparatus 200 according to a first embodiment of the present disclosure. The isolated signal transmission apparatus 200 isolatedly transmits a pulse signal. The isolated signal transmission apparatus 200 is used as, for example, a gate drive circuit that drives a semiconductor switching element such as a power device. The isolated signal transmission apparatus 200 includes an oscillator 171, a modulator 172, a positive-side electromagnetic resonant coupler 180, a negative-side electromagnetic resonant coupler 181, and a radio-frequency signal reception circuit 100.

The oscillator 171 generates a radio-frequency wave used as a carrier.

The radio-frequency wave is at, for example, a frequency of 100 MHz or higher.

The modulator 172 modulates the carrier with an input pulse signal, thereby generating a positive-side modulated signal and a negative-side modulated signal. When the input pulse signal indicates a first value (here, high level), a carrier appears in the positive-side modulated signal. When the input pulse signal indicates a second value (here, low level), a carrier appears in the negative-side modulated signal. The modulator 172 may be, for example, a mixer that outputs, as the positive-side modulated signal, a signal obtained by multiplying the input pulse signal by the carrier, and also outputs, as the negative-side modulated signal, a signal obtained by inverting the input pulse signal and multiplying the resulting inverted signal by the carrier from the oscillator 171. Alternatively, the modulator 172 may be, for example, a one-input two-output switch that outputs the carrier to the positive-side electromagnetic resonant coupler 180 when the input pulse signal indicates the first value, and also outputs the carrier to the negative-side electromagnetic resonant coupler 181 when the input pulse signal indicates the second value.

The positive-side electromagnetic resonant coupler 180 isolatedly transmits the positive-side modulated signal with electromagnetic resonance. The positive-side electromagnetic resonant coupler 180 includes, for example, two oppositely disposed open rings.

The negative-side electromagnetic resonant coupler 181 is a non-contact signal transmitter that isolatedly transmits the negative-side modulated signal with electromagnetic resonance. The negative-side electromagnetic resonant coupler 181 includes, for example, two oppositely disposed open rings.

The radio-frequency signal reception circuit 100 detects input signals. The input signals include a positive-side input signal, which is input from the positive-side electromagnetic resonant coupler 180, and a negative-side input signal, which is input from the negative-side electromagnetic resonant coupler 181. The positive-side input signal is the positive-side modulated signal that has been isolatedly transmitted by the positive-side electromagnetic resonant coupler 180. The negative-side input signal is the negative-side modulated signal that has been isolatedly transmitted by the negative-side electromagnetic resonant coupler 181.

The radio-frequency signal reception circuit 100 includes input reference terminals 102 to which the reference potential of the input signal is applied, a positive-side input terminal 101 into which the positive-side input signal is input, a negative-side input terminal 105 into which the negative-side input signal is input, an output terminal 103 and an output reference terminal 104 from which a detected pulse signal is output as an output signal, a positive-side detector circuit 106, a negative-side detector circuit 108, and a transistor 110.

The positive-side detector circuit 106 is a demodulator circuit. The positive-side detector circuit 106 detects the positive-side input signal and then outputs a positive-voltage pulse signal to the output terminal 103 on the basis of the potential of the input reference terminal 102. The positive-side detector circuit 106 includes a positive-side coupling capacitor 120, a positive-side diode 121, a positive-side inductor 122, and a positive-side smoothing capacitor 123. One end of the positive-side coupling capacitor 120 is connected to the positive-side input terminal 101. The cathode of the positive-side diode 121 is connected to the other end of the positive-side coupling capacitor 120, and the anode of the positive-side diode 121 is connected to the input reference terminal 102. One end of the positive-side inductor 122 is connected to the other end of the positive-side coupling capacitor 120. The positive-side smoothing capacitor 123 is connected between the other end of the positive-side inductor 122 and the input reference terminal 102.

The negative-side detector circuit 108 is a demodulator circuit. The negative-side detector circuit 108 detects the negative-side input signal and then outputs a positive-voltage pulse signal to the output reference terminal 104 on the basis of the potential of the input reference terminal 102. The negative-side detector circuit 108 includes a negative-side coupling capacitor 130, a negative-side diode 131, a negative-side inductor 132, and a negative-side smoothing capacitor 133. One end of the negative-side coupling capacitor 130 is connected to the negative-side input terminal 105. The cathode of the negative-side diode 131 is connected to the other end of the negative-side coupling capacitor 130, and the anode of the negative-side diode 131 is connected to the input reference terminal 102. One end of the negative-side inductor 132 is connected to the other end of the negative-side coupling capacitor 130. The negative-side smoothing capacitor 133 is connected between the other end of the negative-side inductor 132 and the input reference terminal 102.

The transistor 110 is a normally-on transistor. In the transistor 110, the drain terminal and the gate terminal are connected to the input reference terminal 102, and the source terminal is connected to the output reference terminal 104. The transistor 110 is, for example, an N-type field-effect transistor (FET).

In the radio-frequency signal reception circuit 100 having the structure described above, the positive-side detector circuit 106 outputs a pulse signal to the output terminal 103 on the basis of the potential of the input reference terminal 102. This pulse signal indicates a positive voltage when a carrier appears in the positive-side input signal, and also indicates a reference voltage when a carrier does not appear in the positive-side input signal. The negative-side detector circuit 108 outputs a pulse signal to the output reference terminal 104 on the basis of the potential of the input reference terminal 102. This pulse signal indicates a positive voltage when a carrier appears in the negative-side input signal, and also indicates a reference voltage when a carrier does not appear in the negative-side input signal. When the negative-side detector circuit 108 outputs the reference voltage to the output reference terminal 104, the reference voltage is applied to the source terminal of the transistor 110 and thereby the transistor 110 is in on state. When the negative-side detector circuit 108 outputs the positive voltage to the output reference terminal 104, the positive voltage is applied to the source terminal of the transistor 110 and thereby the transistor 110 is in off state.

For example, when the input pulse signal indicates a first value (here, high level), a carrier appears in the positive-side input signal but does not appear in the negative-side input signal. In this case, the positive-side detector circuit 106 outputs the positive voltage to the output terminal 103, and the negative-side detector circuit 108 outputs the reference voltage to the output reference terminal 104. As a result, the positive voltage is output to the output terminal 103 on the basis of the potential of the output reference terminal 104. On the other hand, when the input pulse signal indicates a second value (here, low level), a carrier does not appear in the positive-side input signal but appears in the negative-side input signal. In this case, the positive-side detector circuit 106 outputs the reference voltage to the output terminal 103, and the negative-side detector circuit 108 outputs the positive voltage to the output reference terminal 104. As a result, the negative voltage is output to the output terminal 103 on the basis of the potential of the output reference terminal 104. The radio-frequency signal reception circuit 100 performs an output operation of a bipolar in this way.

An example of the structure and operation of the isolated signal transmission apparatus 200 will be described below in more detail.

The modulator 172 modulates a radio-frequency wave, which is obtained from the oscillator 171, according to the input pulse signal, thereby generating two amplitude modulated signals, i.e., the positive-side modulated signal and the negative-side modulated signal. The positive-side modulated signal and the negative-side modulated signal are complementary to each other. The positive-side electromagnetic resonant coupler 180 carries out contactless power transmission for the positive-side modulated signal. The negative-side electromagnetic resonant coupler 181 carries out contactless power transmission for the negative-side modulated signal. The radio-frequency signal reception circuit 100 demodulates the two amplitude modulated signals to generate an output signal. In this manner, the isolated signal transmission apparatus 200 outputs the output signal with a bipolar voltage according to the input pulse signal.

With the electromagnetic resonant couplers 180, 181, the transmission side and reception side of the electromagnetic resonant couplers are isolated from each other. Here, isolation means that the signal lines on the transmission side and the signal lines on the reception side are electrically isolated from each other and that ground on the transmission side and ground on the reception side are electrically isolated from each other. The radio-frequency wave has a higher frequency than the input pulse signal. The frequency of the radio-frequency wave is, for example, 100 MHz or higher. Since a radio-frequency wave is used as a carrier, the sizes of the electromagnetic resonant couplers 180, 181 can be reduced. In addition, the electromagnetic resonant couplers can transmit electric power efficiently even when the distance between resonators is large. Thus, the isolated signal transmission apparatus 200 can achieve a high withstand voltage according to the distance between the electromagnetic resonant couplers, with a small loss.

The radio-frequency signal reception circuit 100 includes the positive-side input terminal 101, the negative-side input terminal 105, the input reference terminal 102, the output terminal 103, and the output reference terminal 104. The positive-side input terminal 101 receives the positive-side input signal from the positive-side electromagnetic resonant coupler 180. The negative-side input terminal 105 receives the negative-side input signal from the negative-side electromagnetic resonant coupler 181. The input reference terminal 102 is connected to the ground of the positive-side electromagnetic resonant coupler 180 and the ground of the negative-side electromagnetic resonant coupler 181. An output signal is output from the output terminal 103 on the basis of the output reference terminal 104. The output signal is, for example, a gate signal for driving the gate of a semiconductor switching element such as a power device.

The positive-side diode 121, positive-side inductor 122, and positive-side smoothing capacitor 123 included in the positive-side detector circuit 106 rectify the positive-side input signal received from the positive-side input terminal 101, and thereby generates a positive voltage which is applied to the cathode of the positive-side diode 121 on the basis of its anode.

The negative-side diode 131, negative-side inductor 132, and negative-side smoothing capacitor 133 included in the negative-side detector circuit 108 rectify the negative-side input signal received from the negative-side input terminal 105, and thereby generates a positive voltage which is applied to the cathode of the negative-side diode 131 on the basis of its anode.

In the positive-side detector circuit 106, the positive-side input terminal 101 and the cathode of the positive-side diode 121 are mutually connected with the positive-side coupling capacitor 120 located between them. The cathode of the positive-side diode 121 and one end of the positive-side inductor 122 are mutually connected. The other end of the positive-side inductor 122, one end of the positive-side smoothing capacitor 123, and the output terminal 103 are mutually connected. The other end of the positive-side smoothing capacitor 123, the anode of the positive-side diode 121, and the input reference terminal 102 are mutually connected. The input reference terminal 102 and the ground of the positive-side electromagnetic resonant coupler 180 are mutually connected. The positive-side detector circuit 106 may have any other structure if the positive-side detector circuit 106 is a detector circuit that can generate a positive voltage, which is applied to the output terminal 103 on the basis of the potential of the input reference terminal 102.

In the negative-side detector circuit 108, the negative-side input terminal 105 and the cathode of the negative-side diode 131 are mutually connected with the negative-side coupling capacitor 130 located between them. The cathode of the negative-side diode 131 and one end of the negative-side inductor 132 are mutually connected. The other end of the negative-side inductor 132, one end of the negative-side smoothing capacitor 133, and the output reference terminal 104 are mutually connected. The other end of the negative-side smoothing capacitor 133, the anode of the negative-side diode 131, and the input reference terminal 102 are mutually connected. The input reference terminal 102 and the ground of the negative-side electromagnetic resonant coupler 181 are mutually connected. The negative-side detector circuit 108 may have any other structure if the negative-side detector circuit 108 is a detector circuit that can generate a positive voltage, which is applied to the output reference terminal 104 on the basis of the potential of the input reference terminal 102.

The input reference terminal 102 is connected to the drain terminal and gate terminal of the transistor 110. The source terminal of the transistor 110 is connected to the output reference terminal 104. The transistor 110 is a normally-on transistor; the threshold voltage of the gate terminal is lower than 0 V. If, for example, the threshold voltage is −2.5 V, when the gate voltage based on the potential of the source terminal is 0 V, the transistor is in on state and the part between the drain terminal and the source terminal is conductive. When the gate voltage based on the potential of the source terminal is −3.0 V, the transistor is in off state and the part between the drain terminal and the source terminal is nonconductive. The transistor 110 may be, for example, a gallium nitride (GaN) transistor.

The transistor 110 is, for example, an N-channel transistor. A resistor may be inserted between the gate terminal and source terminal of the transistor 110. A resistor may be inserted between the output terminal 103 and the output reference terminal 104.

The isolated signal transmission apparatus 200 can output a positive voltage from the output terminal 103 when the input pulse signal indicates the high level, and output a negative voltage from the output terminal 103 when the input pulse signal indicates the low level. Specifically, the isolated signal transmission apparatus 200 can supply a large negative voltage. As a result, when a semiconductor transistor connected to the output terminal 103 is to be turned off, for example, the isolated signal transmission apparatus 200 can reliably draw charges from the gate of the semiconductor transistor at high speed.

Next, an example of an operation of the radio-frequency signal reception circuit 100 will be described. The radio-frequency signal reception circuit 100 detects a carrier input from the positive-side input terminal 101 and thereby outputs a positive voltage to the output terminal 103 on the basis of the potential of the output reference terminal 104. The radio-frequency signal reception circuit 100 detects a carrier input from the negative-side input terminal 105 and thereby outputs a positive voltage to the output reference terminal 104 on the basis of the potential of the output terminal 103. That is, the radio-frequency signal reception circuit 100 outputs a negative voltage to the output terminal 103 on the basis of the potential of the output reference terminal 104.

The gate terminal of a power semiconductor switching element, for example, is connected to the output terminal 103 and the source terminal of the power semiconductor switching element, for example, is connected to the output reference terminal 104.

An example of an operation to turn off a power semiconductor switching element will be described with reference to FIG. 2.

Figure 2:
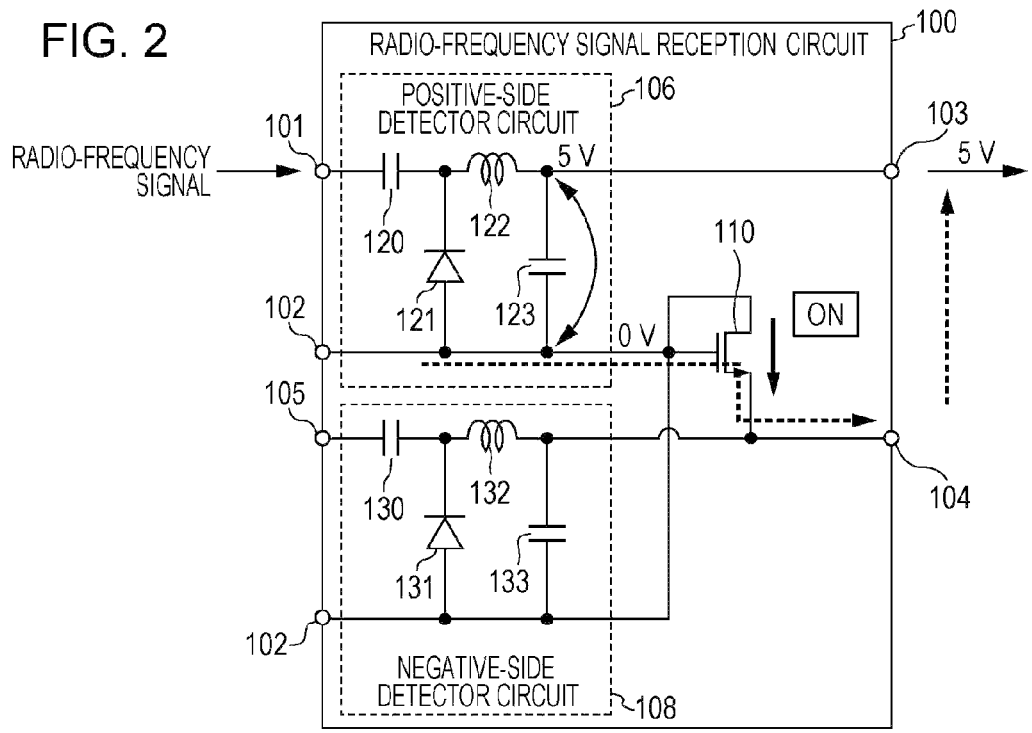
FIG. 2 illustrates an example of an operation performed by a radio-frequency signal reception circuit according to the first embodiment of the present disclosure to output an on voltage.

FIG. 2 illustrates an example of voltages at individual terminals of the radio-frequency signal reception circuit 100 when a carrier appears in the positive-side input signal input from the positive-side input terminal 101. In this case, the radio-frequency signal reception circuit 100 outputs a positive voltage through the output terminal 103 on the basis of the potential of the output reference terminal 104.

In the example in FIG. 2, the positive-side detector circuit 106 generates a voltage of 5 V at one end of the positive-side inductor 122 on the basis of the input reference terminal 102. At that time, the gate terminal of the transistor 110 is at 0 V because the gate terminal is connected to the input reference terminal 102. The source terminal of the transistor 110 is also at 0 V because the source terminal is connected to the negative-side detector circuit 108, which does not generate a voltage. Therefore, the transistor 110, which is a normally-on transistor, is turned on, and thereby the part between the drain terminal and source terminal of the transistor 110 becomes conductive, that is, the input reference terminal 102 and output reference terminal 104 are electrically connected to each other through the transistor 110. As a result, the voltage generated by the positive-side detector circuit 106 is output from the output terminal 103 on the basis of the potential of the output reference terminal 104. This positive voltage is on voltage, which turns on the power semiconductor switching element.

An example of an operation to turn off a power semiconductor switching element will be described with reference to FIG. 3.

Figure 3:
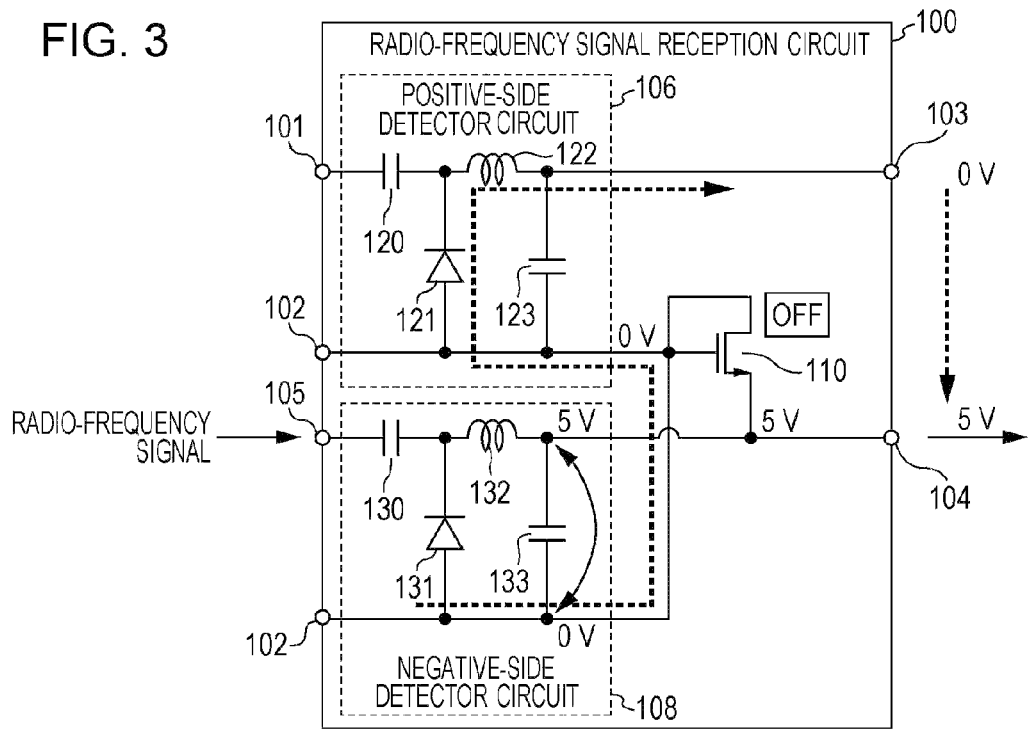
FIG. 3 illustrates an example of an operation performed by the radio-frequency signal reception circuit according to the first embodiment of the present disclosure to output an off voltage.

FIG. 3 illustrates an example of voltages at individual terminals of the radio-frequency signal reception circuit 100 when a carrier appears in the negative-side input signal input from the negative-side input terminal 105. In this case, the radio-frequency signal reception circuit 100 outputs a negative voltage through the output terminal 103 on the basis of the potential of the output reference terminal 104.

In the example in FIG. 3, the negative-side detector circuit 108 generates a voltage of 5 V at one end of the positive-side inductor 122 on the basis of the input reference terminal 102. At that time, the gate terminal of the transistor 110 is at 0 V because the gate terminal is connected to the input reference terminal 102. The source terminal of the transistor 110 is at 5 V because the source terminal is connected to the end of negative-side inductor 132. Accordingly, the gate terminal of the transistor 110 is at −5 V based on the potential of the source terminal. Therefore, the transistor 110, which is a normally-on transistor, is turned off, and thereby the output reference terminal 104 and the input reference terminal 102 are open. Since the positive-side detector circuit 106 does not generate a voltage, the output terminal 103 is at about 0 V based on the potential of the input reference terminal 102. As a result, a negative voltage of −5 V is output from the output terminal 103 on the basis of the potential of the output reference terminal 104.

The radio-frequency signal reception circuit 100 can supply a voltage that causes the output terminal 103 to become negative based on the potential of the output reference terminal 104. Therefore, when a power semiconductor switching element is turned off, for example, the radio-frequency signal reception circuit 100 can actively draw charges accumulated at the gate of the power semiconductor switching element. Thus, the radio-frequency signal reception circuit 100 can turn off the power semiconductor switching element at high speed.

When a carrier is input into the radio-frequency signal reception circuit 100 through the positive-side input terminal 101, the radio-frequency signal reception circuit 100 can apply a positive output voltage through the output terminal 103 to the gate of the power semiconductor switching element, thereby causing the power semiconductor switching element to be turned on. When a carrier is input into the radio-frequency signal reception circuit 100 through the negative-side input terminal 105, the radio-frequency signal reception circuit 100 can apply a negative output voltage through the output terminal 103 to the gate of the power semiconductor switching element, thereby causing the power semiconductor switching element to be turned off. Accordingly, the radio-frequency signal reception circuit 100 can switch the polarity of an output voltage depending on whether a carrier is input into the positive-side input terminal 101 or negative-side input terminal 105.

Since the radio-frequency signal reception circuit 100 can apply a negative voltage to the gate terminal of a power semiconductor switching element, the radio-frequency signal reception circuit 100 can stably maintain the off state of the power semiconductor switching element and can thereby prevent the power semiconductor switching element from malfunctioning. With a conventional gate drive circuit, a power semiconductor switching element in the off state may malfunction due to external noise. On the other hand, the radio-frequency signal reception circuit 100, while the power semiconductor switching element is in off state, continues to apply a negative voltage to the gate terminal thereof, it can be prevented that the gate potential of the power semiconductor switching element exceeds the threshold thereof. The radio-frequency signal reception circuit 100 is particularly effective to prevent the malfunction of a switching device, such as a GaN power device, with a low threshold voltage of, for example, 1.5 V.

Since the radio-frequency signal reception circuit 100 includes a normally-on transistor as the transistor 110, the radio-frequency signal reception circuit 100 operates at high speed. In addition, the isolated signal transmission apparatus 200 includes electromagnetic resonant couplers as isolators, the isolated signal transmission apparatus 200 can transmit a signal at high speed compared with a transformer in which energy is accumulated. With a conventional gate drive circuit including an optical coupler or a transformer as isolators, there has been a need to separately provide a circuit that controls the on and off states of a signal on the secondary side. However, a gate drive circuit to which the isolated signal transmission apparatus 200 is applied can transmit a modulated signal generated on the primary side to the secondary side without alteration.

Figure 4:
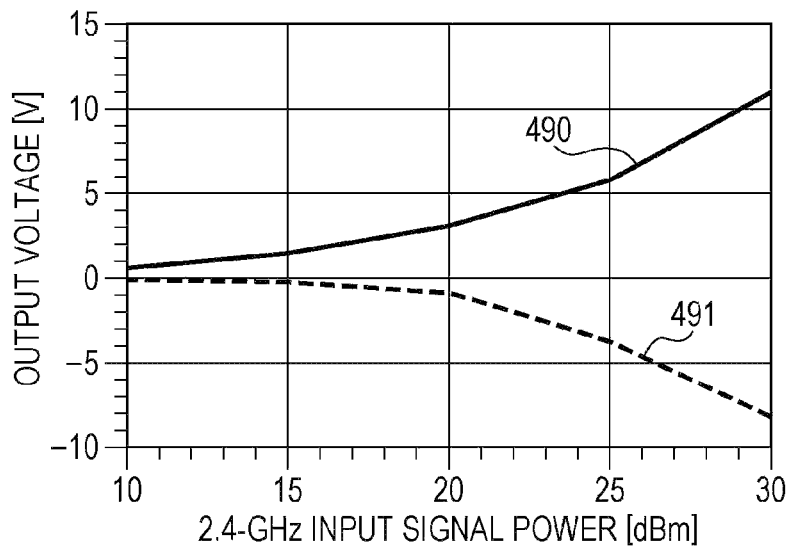
FIG. 4 illustrates an example of output voltage with respect to input signal intensity in the radio-frequency signal reception circuit according to the first embodiment of the present disclosure.

FIG. 4 illustrates an example of output voltage with respect to the intensity (magnitude) of an input signal input into the radio-frequency signal reception circuit 100. In this drawing, the output voltage is a voltage at the output terminal 103 on the basis of potential of the output reference terminal 104. The solid line 490 indicates an output voltage when a carrier is input into the positive-side input terminal 101, and the broken line 491 indicates an output voltage when a carrier is input into the negative-side input terminal 105.

As illustrated in FIG. 4, the larger the intensity of the input signal is, the larger the absolute value of output voltages are. As seen from FIG. 4, the radio-frequency signal reception circuit 100 outputs a positive voltage when a carrier is input into the positive-side input terminal 101 and outputs a negative voltage when a carrier is input into the negative-side input terminal 105. This is because the radio-frequency signal reception circuit 100 includes the transistor 110 and thereby it is possible to prevent an output path from the positive-side detector circuit 106 and an output path from the negative-side detector circuit 108 from being mutually connected. Particularly, the radio-frequency signal reception circuit 100 illustrated in FIG. 1 can output a large negative voltage.

The positive-side diode 121 and negative-side diode 131 may be a diode having a small junction capacity that operates at a radio frequency, such as, for example, a Schottky diode.

The power semiconductor switching element may not be a GaN switching device that is turned on with a gate voltage of 3 V. The power semiconductor switching element may be any other power device.

If, for example, the radio frequency is 2.4 GHz and the radio-frequency signal reception circuit 100 includes GaN Schottky barrier diodes as the positive-side diode 121 and negative-side diode 131, the inductances of the positive-side inductor 122 and negative-side inductor 132 may be 5.8 nH and the capacitances of the positive-side coupling capacitor 120 and negative-side coupling capacitor 130 may be 0.4 pF. In this case, the positive-side detector circuit 106 and negative-side detector circuit 108 operate as a detector circuit at 2.4 GHz.

Although this embodiment has been described for examples in which the isolator is an electromagnetic resonant coupler, the isolator may be an element other than the electromagnetic resonant coupler if the element can isolate a radio-frequency signal and can transmit the isolated radio-frequency signal.

Second Embodiment

An example of an isolated signal transmission apparatus in a second embodiment of the present disclosure will be described. The isolated signal transmission apparatus in the second embodiment differs from the first embodiment only in the structure of the radio-frequency signal reception circuit. Therefore, only the radio-frequency signal reception circuit in the second embodiment will be described below.

Figure 5:
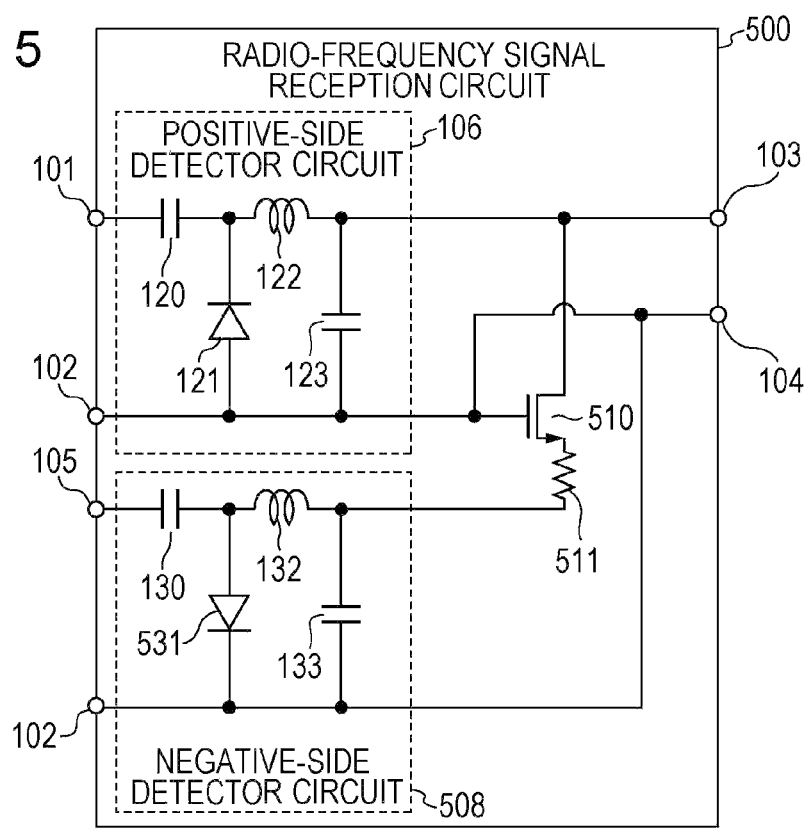
FIG. 5 is an example of a radio-frequency signal reception circuit according to a second embodiment of the present disclosure.

FIG. 5 is an example of the radio-frequency signal reception circuit 500 in the second embodiment of the present disclosure. The radio-frequency signal reception circuit 500 includes input reference terminals 102 to which the reference potential of the input signal is applied, a positive-side input terminal 101 into which the positive-side input signal is input, a negative-side input terminal 105 into which the negative-side input signal is input, an output reference terminal 104 connected to the input reference terminal 102, an output terminal 103 from which a detected pulse signal is output as an output signal, a positive-side detector circuit 106 that detects the positive-side input signal and outputs a positive-voltage pulse signal to the output terminal 103, a transistor 510, a negative-side detector circuit 508 that detects the negative-side input signal and outputs a negative-voltage pulse signal to the source terminal of the transistor 510, and a resistor 511. The positive-voltage pulse signal and the negative-voltage pulse signal are based on the potential of the input reference terminal 102.

The radio-frequency signal reception circuit 500 is the same as in the first embodiment in that the radio-frequency signal reception circuit 500 outputs a bipolar output voltage, but differs from the radio-frequency signal reception circuit 100 illustrated in FIG. 1 in the structure of the negative-side detector circuit 508, the connection form of the transistor 510, and the presence of the resistor 511. Descriptions below will focus on differences from the first embodiment.

The negative-side detector circuit 508 is a demodulator circuit that detects the negative-side input signal and outputs a negative-voltage pulse signal to the source terminal of the transistor 510 on the basis of the potential of the input reference terminal 102. Specifically, the negative-side output signal is generated by detecting the negative-side input signal, and then is output to the source terminal of the transistor 510 through the resistor 511. The negative-side detector circuit 508 includes a negative-side coupling capacitor 130, a negative-side diode 531, a negative-side inductor 132, and a negative-side smoothing capacitor 133. One end of the negative-side coupling capacitor 130 is connected to the negative-side input terminal 105. The anode of the negative-side diode 531 is connected to the other end of the negative-side coupling capacitor 130, and the cathode of the negative-side diode 531 is connected to the input reference terminal 102. One end of the negative-side inductor 132 is connected to the other end of the negative-side coupling capacitor 130. The negative-side smoothing capacitor 133 is connected between the other end of the negative-side inductor 132 and the input reference terminal 102.

The transistor 510 is a normally-off transistor. In the transistor 510, the drain terminal is connected to the output terminal 103, the gate terminal is connected to the output reference terminal 104, and the source terminal is connected to one end of the resistor 511. The transistor 510 is, for example, an N-type FET.

The resistor 511 is connected between the source terminal of the transistor 510 and an output end of the negative-side detector circuit 508. The output end is a node between the negative-side inductor 132 and the negative-side smoothing capacitor 133.

In the radio-frequency signal reception circuit 500 having the structure described above, the positive-side detector circuit 106 outputs a pulse signal to the output terminal 103 on the basis of the potential of the input reference terminal 102. This pulse signal takes a positive voltage when a carrier appears in the positive-side input signal, and also takes a reference voltage when a carrier does not appear in the positive-side input signal. The negative-side detector circuit 508 outputs a pulse signal to the source terminal of the transistor 510 on the basis of the potential of the input reference terminal 102. This pulse signal takes a negative voltage when a carrier appears in the negative-side input signal, and also takes the reference voltage when a carrier does not appear in the negative-side input signal. The transistor 510 is in on state while the negative-side detector circuit 108 outputs a negative voltage to the source terminal of the transistor 510. The transistor 510 is in off state while the negative-side detector circuit 108 outputs the reference voltage.

For example, when the input pulse signal takes a first value (here, high level), a carrier appears in the positive-side input signal but does not appear in the negative-side input signal. In this case, the positive-side detector circuit 106 outputs the positive voltage to the output terminal 103, and the negative-side detector circuit 508 outputs the reference voltage to the source terminal of the transistor 510. As a result, the positive voltage is output to the output terminal 103 on the basis of the potential of the output reference terminal 104. On the other hand, when the input pulse signal takes a second value (here, low level), a carrier does not appear in the positive-side input signal but appears in the negative-side input signal. In this case, the positive-side detector circuit 106 outputs the reference voltage to the output terminal 103, and the negative-side detector circuit 508 outputs a negative voltage to the source terminal of the transistor 510. As a result, the negative voltage is output to the output terminal 103 on the basis of the potential of the output reference terminal 104. The radio-frequency signal reception circuit 500 performs an output operation of a bipolar in this way.

An example of the structure and operation of the isolated signal transmission apparatus 200 will be described below in more detail.

The radio-frequency signal reception circuit 500 includes the positive-side input terminal 101, the negative-side input terminal 105, the input reference terminals 102, the output terminal 103 from which a gate signal is output to a power device, i.e., a load, and the output reference terminal 104, the voltage at which is the reference voltage for the output terminal 103.

In the positive-side detector circuit 106, a positive-side diode 121, a positive-side inductor 122, and a positive-side smoothing capacitor 123 rectify the positive-side input signal received from the positive-side input terminal 101, and thereby generates a positive voltage which is applied to the cathode of the positive-side diode 121 on the basis of its anode.

In the negative-side detector circuit 508, the negative-side diode 531, negative-side inductor 132, and negative-side smoothing capacitor 133 rectify the negative-side input signal received from the negative-side input terminal 105, and thereby generates a negative voltage which is applied to the anode of the negative-side diode 531 on the basis of its cathode.

In the positive-side detector circuit 106, the positive-side input terminal 101 and the cathode of the positive-side diode 121 are mutually connected with the positive-side coupling capacitor 120 located between them. The cathode of the positive-side diode 121 and one end of the positive-side inductor 122 are mutually connected. The other end of the positive-side inductor 122, one end of the positive-side smoothing capacitor 123, and the output terminal 103 are mutually connected. The other end of the positive-side smoothing capacitor 123, the anode of the positive-side diode 121, the input reference terminal 102, and the output reference terminal 104 are connected mutually. The input reference terminal 102 and the ground of the positive-side electromagnetic resonant coupler 180 are mutually connected. The positive-side detector circuit 106 may have any other structure if the positive-side detector circuit 106 can generate a positive voltage, which is applied to the output terminal 103 on the basis of the potential of the input reference terminal 102.

In the negative-side detector circuit 508, the negative-side input terminal 105 and the anode of the negative-side diode 531 are mutually connected with the negative-side coupling capacitor 130 located between them. The anode of the negative-side diode 531 and one end of the negative-side inductor 132 are mutually connected. The other end of the negative-side inductor 132 and one end of the negative-side smoothing capacitor 133 are mutually connected. The other end of the negative-side smoothing capacitor 133, the cathode of the negative-side diode 531, the input reference terminal 102, and the output reference terminal 104 are mutually connected. The input reference terminal 102 and the ground of the negative-side electromagnetic resonant coupler 181 are mutually connected. The negative-side detector circuit 508 may have any other structure if the negative-side detector circuit 508 can generate a negative voltage, which is applied to the source terminal of the transistor 510 on the basis of the potential of the input reference terminal 102.

In addition, the positive-side inductor 122 is connected to the drain terminal of the transistor 510, and the negative-side inductor 132 is connected to the source terminal of the transistor 510 through the resistor 511.

The input reference terminal 102 is connected to the gate terminal of the transistor 510.

The transistor 510 is, for example, a normally-off transistor. The transistor 510 may be, for example, a normally-off GaN transistor.

In the radio-frequency signal reception circuit 500 structured as described above, when a carrier appears in the positive-side input signal received from the positive-side input terminal 101, the transistor 510 is turned off and a current does not flow into the negative-side detector circuit 508. Therefore, a positive voltage is output to the output terminal 103 on the basis of the potential of the output reference terminal 104. On the other hand, when a carrier appears in the negative-side input signal received from the negative-side input terminal 105, the transistor 510 is turned on and the negative voltage generated in the negative-side detector circuit 508 is output from the output terminal 103 through the transistor 510. Therefore, a negative voltage is output to the output terminal 103 on the basis of the potential of the output reference terminal 104.

With the transistor 510 included in the radio-frequency signal reception circuit 500, it can be prevented that an output from the positive-side detector circuit 106 and an output from the negative-side detector circuit 508 are mutually connected. As a result, a large positive voltage and a large negative voltage are selectively output from the radio-frequency signal reception circuit 500. If the transistor 510 is not provided in the radio-frequency signal reception circuit 500, it is difficult to output a large positive voltage and a large negative voltage.

Now, it is assumed as a reference example that the transistor 510 is not provided and the negative-side inductor 132 is connected directly to the output terminal 103. In this case, the radio-frequency signal reception circuit in the reference example has a structure in which an output path from the positive-side detector circuit 106 and an output path from the negative-side detector circuit 508 are mutually connected. Then, even if a carrier is input into the positive-side input terminal 101 and the positive-side detector circuit 106 generates a positive voltage, a current generated by the voltage flows into the negative-side diode 531. Therefore, only a voltage lower than the threshold voltage of the negative-side diode 531 is output from the output terminal 103.

FIGS. 6A and 6B illustrate an example of output voltage with respect to the intensity (magnitude) of an input signal in the radio-frequency signal reception circuit 500 in this embodiment. FIG. 6A illustrates the characteristics of the radio-frequency signal reception circuit in the above reference example, which has a structure in which a transistor is not provided and the negative-side inductor 132 is connected directly to the output terminal 103. FIG. 6B illustrates an example of the characteristics of the radio-frequency signal reception circuit 500 in the second embodiment. In FIGS. 6A and 6B, the output voltage is a voltage output at the output terminal 103 on the basis of the potential of the output reference terminal 104. The solid lines rising to the right indicate the output voltage when a carrier is input into the positive-side input terminal 101, and the solid lines falling to the right indicate the output voltage when a carrier is input into the negative-side input terminal 105.

As indicated by the solid line falling to the right in FIG. 6A, the radio-frequency signal reception circuit in the reference circuit outputs a negative voltage only when the input signal has a certain magnitude (about 17 dBm) or more. By contrast, as indicated by the solid line falling to the right in FIG. 6B, even if the voltage of the input signal is low, the radio-frequency signal reception circuit 500 in this embodiment outputs a negative voltage according to the input voltage. That is, unlike the reference example, the radio-frequency signal reception circuit 500 in this embodiment has superior responsiveness to a radio-frequency signal with a low voltage.

OTHER EMBODIMENTS

The first and second embodiments of the radio-frequency signal reception circuit and isolated signal transmission apparatus according to the present disclosure have been described, but the present disclosure is not restricted to these embodiments. The range of one or a plurality of aspects of the present disclosure may include embodiments in which various variations that a person having ordinary skill in the art thinks of are applied to the first and second embodiments and may also include embodiments in which constituent elements in different embodiments are combined, without departing from the intended scope of the present disclosure.

For example, in a radio-frequency signal reception circuit that detects an input signal, which is obtained by modulating a carrier with a pulse signal: the input signal may include a positive-side input signal in which a carrier appears in a period during which the pulse signal takes a first value and a negative-side input signal in which a carrier appears in a period during which the pulse signal takes a second value; and the radio-frequency signal reception circuit may include an input reference terminal to which the reference potential of the input signal is applied, a positive-side input terminal into which the positive-side input signal is input, a negative-side input terminal into which the negative-side input signal is input, an output terminal and an output reference terminal from which the detected pulse signal is output, a positive-side detector circuit that detects the positive-side input signal and outputs a positive-voltage pulse signal to the output terminal with respect to the voltage at the input reference terminal, a negative-side detector circuit that detects the negative-side input signal and outputs a positive-voltage pulse signal to the output reference terminal with respect to the voltage at the input reference terminal, and a transistor, the drain terminal and gate terminal of which are connected to the input reference terminal and the source terminal of which is connected to the output reference terminal.

For example: the positive-side detector circuit may output, to the output terminal, a pulse signal that has a positive voltage when a carrier appears in the positive-side input signal and has the reference voltage when a carrier does not appear in the positive-side input signal; the negative-side detector circuit may output, to the output reference terminal, a pulse signal that has a positive voltage when a carrier appears in the negative-side input signal and has the reference voltage when a carrier does not appear in the negative-side input signal; and the transistor may be turned on while the negative-side detector circuit outputs the reference voltage to the output reference terminal and may be turned off while the negative-side detector circuit outputs the positive voltage to the output reference terminal.

For example: the positive-side detector circuit may include a positive-side coupling capacitor, one end of which is connected to the positive-side input terminal, a positive-side diode, the cathode of which is connected to the other end of the positive-side coupling capacitor and the anode of which is connected to the input reference terminal, a positive-side inductor, one end of which is connected to the other end of the positive-side coupling capacitor, and a positive-side smoothing capacitor connected between the other end of the positive-side inductor and the input reference terminal; and the negative-side detector circuit may include a negative-side coupling capacitor, one end of which is connected to the negative-side input terminal, a negative-side diode, the cathode of which is connected to the other end of the negative-side coupling capacitor and the anode of which is connected to the input reference terminal, a negative-side inductor, one end of which is connected to the other end of the negative-side coupling capacitor, and a negative-side smoothing capacitor connected between the other end of the negative-side inductor and the input reference terminal.

For example, in a radio-frequency signal reception circuit that detects an input signal, which is obtained by modulating a carrier with a pulse signal: the input signal may include a positive-side input signal in which a carrier appears when the pulse signal takes a first value and a negative-side input signal in which a carrier appears when the pulse signal takes a second value; and the radio-frequency signal reception circuit may include an input reference terminal to which the reference potential of the input signal is applied, a positive-side input terminal into which the positive-side input signal is input, a negative-side input terminal into which the negative-side input signal is input, an output reference terminal connected to the input reference terminal, an output terminal used to output the detected pulse signal, a positive-side detector circuit that detects the positive-side input signal and outputs a positive-voltage pulse signal to the output terminal with respect to the voltage at the input reference terminal, a transistor, the drain terminal of which is connected to the output terminal and the gate terminal of which is connected to the output reference terminal, and a negative-side detector circuit that detects the negative-side input signal and outputs a negative-voltage pulse signal to the source terminal of the transistor with respect to the voltage at the input reference terminal.

For example: the positive-side detector circuit may output, to the output terminal, a pulse signal that has a positive voltage when a carrier appears in the positive-side input signal and has the reference voltage when a carrier does not appear in the positive-side input signal; the negative-side detector circuit may output, to the source terminal of the transistor, a pulse signal that has a negative voltage when a carrier appears in the negative-side input signal and has the reference voltage when a carrier does not appear in the negative-side input signal; and the transistor may be turned on while the negative-side detector circuit outputs the negative voltage to the source terminal of the transistor and may be turned off while the negative-side detector circuit outputs the reference voltage to the source terminal of the transistor.

For example: the positive-side detector circuit may include a positive-side coupling capacitor, one end of which is connected to the positive-side input terminal; a positive-side diode, the cathode of which is connected to the other end of the positive-side coupling capacitor and the anode of which is connected to the input reference terminal, a positive-side inductor, one end of which is connected to the other end of the positive-side coupling capacitor, and a positive-side smoothing capacitor connected between the other end of the positive-side inductor and the input reference terminal; and the negative-side detector circuit may include a negative-side coupling capacitor, one end of which is connected to the negative-side input terminal, a negative-side diode, the anode of which is connected to the other end of the negative-side coupling capacitor and the cathode of which is connected to the input reference terminal, a negative-side inductor, one end of which is connected to the other end of the negative-side coupling capacitor, and a negative-side smoothing capacitor connected between the other end of the negative-side inductor and the input reference terminal.

For example, an isolated signal transmission apparatus that isolatedly transmits a pulse signal may include an oscillator that generates a carrier, a modulator that modulates the carrier generated by the oscillator with the pulse signal to generate a positive-side modulated signal in which the carrier appears in a period during which the pulse signal takes a first value and to generate a negative-side modulated signal in which the carrier appears in a period during which the pulse signal takes a second value, a positive-side electromagnetic resonant coupler that isolatedly transmits the positive-side modulated signal, generated by the modulator, with electromagnetic resonance, a negative-side electromagnetic resonant coupler that isolatedly transmits the negative-side modulated signal, generated by the modulator, with electromagnetic resonance, and the radio-frequency signal reception circuit described above, which detects an input signal that includes a signal output from the positive-side electromagnetic resonant coupler as the positive-side input signal and also includes a signal output from the negative-side electromagnetic resonant coupler as the negative-side input signal.

In the embodiments described above, the signal isolator may be, for example, an element other than the electromagnetic resonant coupler if the element can isolate a radio-frequency signal and can transmit the isolated radio-frequency signal.

The transistor may be, for example, an N-channel transistor or a P-channel transistor.

In the present disclosure, the term "positive side" is used for circuits, circuit elements, and signals all of which are involved in generation, transmission, and output of a positive voltage, in a case in which the isolated signal transmission apparatus outputs the positive signal to an externally connected load. Similarly, the term "negative side" is used for circuits, circuit elements, and signals all of which are involved in generation, transmission, and output of a negative voltage, in a case in which the isolated signal transmission apparatus outputs the negative signal to an externally connected load. The polarity of the voltage output from the isolated signal transmission apparatus corresponds to the polarity of the output terminal with respect to the polarity of the output reference terminal. Therefore, the negative-side detector circuit is not always a circuit that detects a negative voltage.

In the present disclosure, the positive-side input terminal, negative-side input terminal, positive-side electromagnetic resonant coupler, negative-side electromagnetic resonant coupler, positive-side detector circuit, and negative-side detector circuit may be respectively referred to as the first input terminal, second input terminal, first electromagnetic resonant coupler, second electromagnetic resonant coupler, first detector circuit, and second detector circuit. The positive-side modulated signal, negative-side modulated signal, positive-side input signal, and negative-side input signal may be respectively referred to as the first modulated signal, second modulated signal, first input signal, and second input signal. The positive-side coupling capacitor, negative-side coupling capacitor, positive-side diode, negative-side diode, positive-side inductor, negative-side inductor, positive-side smoothing capacitor, and negative-side smoothing capacitor may be respectively referred to as the first coupling capacitor, second coupling capacitor, first diode, second diode, first inductor, second inductor, first smoothing capacitor, and second smoothing capacitor.

Although, for example, the first modulated signal illustrated in FIG. 1 has a waveform of only components with voltages of 0 V or more, the first modulated signal may also have a waveform of components with a voltage of less than 0 V. That is, the first modulated signal has a waveform with an envelop that is, for example, symmetrical on the positive-side and on the negative-side with respect to 0 V. Similarly, although the second modulated signal illustrated in FIG. 1 has a waveform of only components with voltages of 0 V or more, the second modulated signal may also have a waveform of components with a voltage of less than 0 V. That is, the second modulated signal has a waveform with an envelop that is, for example, symmetrical on the positive-side and on the negative-side with respect to 0 V.

The first input signal indicates a first amplitude in a first period and also indicates a second amplitude, which is smaller than the first amplitude, in a second period, which differs from the first period. The second input signal indicates a third amplitude in a third period and also indicates a fourth amplitude, which is smaller than the third amplitude, in a fourth period, which differs from the third period.

If a pulse signal input into the isolated signal transmission apparatus 200 has two values, a first value and a second value, a pulse inverted signal obtained by inverting the pulse signal takes the second value (e.g., low level) in correspondence to a period during which the pulse signal takes the first value (e.g., high level) and also takes the first value (e.g., high level) in correspondence to a period during which the pulse signal takes the second value (e.g., low level), for example. Therefore, if a carrier is modulated with a pulse signal to generate the first modulated signal (i.e., the first input signal) and a carrier is modulated with a pulse inverted signal to generate the second modulated signal (i.e., the second input signal), the first period in the first input signal corresponds to the fourth period in the second input signal and the second period in the first input signal corresponds to the third period in the second input signal.

The period during which the first input signal indicates the first amplitude is a period during which a waveform appears that has almost the same frequency as a radio-frequency wave, which is a carrier, and also has a non-0 amplitude. The period during which the second input signal indicates the third amplitude is a period during which a waveform that has almost the same frequency as a radio-frequency wave, which is a carrier, and also has a non-0 amplitude. The first amplitude of the first input signal and the third amplitude of the second input signal may be the same value. The second amplitude of the first input signal and the fourth amplitude of the second input signal may be the same value. The second amplitude of the first input signal and the fourth amplitude of the second input signal may be 0.

In the present disclosure, to simplify descriptions, the period during which the first input signal indicates the first amplitude may be referred to as "when a carrier appears in the first input signal" and the period during which the first input signal indicates the second amplitude may be referred to as "when a carrier does not appear in the first input signal". Similarly, the period during which the second input signal indicates the third amplitude may be referred to as "when a carrier appears in the second input signal" and the period during which the second input signal indicates the fourth amplitude may be referred to as "when a carrier does not appear in the second input signal". When the first amplitude of the first input signal is input or when the third amplitude of the second input signal is input, this may be represented as "a carrier is input". For the first modulated signal and second modulated signal as well, a similar representation may be used.

The voltage pulse generated by the first detector circuit by detecting the first input signal may be referred to as "the first output signal". The voltage pulse generated by the second detector circuit by detecting the second input signal may be referred to as "the second output signal". The output signal output from the radio-frequency signal reception circuit is formed with the first output signal and second output signal. In the radio-frequency signal reception circuit 100 illustrated in FIG. 1, the first output signal is a voltage pulse that causes the output terminal to have a positive polarity with respect to the polarity of the input reference terminal, and the second output signal is a voltage pulse that causes the output reference terminal to have a positive polarity with respect to the polarity of the input reference terminal. In the radio-frequency signal reception circuit 500 illustrated in FIG. 5, the first output signal is a voltage pulse that causes the output terminal to have a positive polarity with respect to the polarity of the input reference terminal, and the second output signal is a voltage pulse that causes the second terminal of the transistor to have a negative polarity with respect to the polarity of the input reference terminal.

In the present disclosure, one of the source terminal and drain terminal of the transistor may by referred to as the first terminal and the other may be referred to as the second terminal. The gate terminal of the transistor may be referred to as a control terminal. That is, the transistor is an element in which a switchover is made so that continuity is established or lost between the first terminal and the second terminal. So far, examples have been described in which the transistor 110 illustrated in FIG. 1 and the transistor 510 illustrated in FIG. 5 are an N-channel transistor. In this case, the drain terminal is the first terminal and the source terminal is the second terminal, for example. However, the transistor 110 and transistor 510 may be a P-type transistor. In this case, the drain terminal is the second terminal and the source terminal is the first terminal.

The radio-frequency signal reception circuit and isolated signal transmission apparatus according to the present disclosure are useful as a gate drive circuit that drives a semiconductor switching element.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A radio-frequency signal reception circuit including:
    a first input terminal into which a first input signal is input, the first input signal including a first modulated radio-frequency signal;
    a second input terminal into which a second input signal is input, the second input signal including a second modulated high frequency signal;
    an input reference terminal to which a reference potential of the first and second input signals is applied;
    an output terminal from which a first output signal is output;
    an output reference terminal from which a second output signal is output;
    a first detector circuit that detects the first input signal and outputs the first output signal to the output terminal, the first output signal including a first positive-voltage pulse based on the reference potential;
    a second detector circuit that detects the second input signal and outputs the second output signal to the output reference terminal, the second output signal including a second positive-voltage pulse based on the reference potential; and
    a transistor that includes a first terminal, a second terminal, and a control terminal, the first terminal and control terminal being connected to the input reference terminal, the second terminal being connected to the output reference terminal.

2. The radio-frequency signal reception circuit according to claim 1, wherein:
    the first detector circuit outputs the first output signal to the output terminal by outputting a first positive voltage based on the reference potential to the output terminal when a first input signal indicates the first amplitude and by outputting a first reference voltage based on the reference potential to the output terminal when the first input signal indicates a second amplitude smaller than the first amplitude; and
    the second detector circuit outputs the second output signal to the output reference terminal by outputting a second positive voltage based on the reference potential to the output reference terminal when the second input signal indicates a third amplitude and by outputting a second reference voltage based on the reference potential to the output reference terminal when the second input signal indicates a fourth amplitude smaller than the third amplitude.

3. The radio-frequency signal reception circuit according to claim 2, wherein:
    when the first detector circuit outputs the first positive voltage to the output terminal, the second detector circuit outputs the second reference voltage to the output reference terminal; and
    when the first detector circuit outputs the first reference voltage to the output terminal, the second detector circuit outputs the second positive voltage to the output reference terminal.

4. The radio-frequency signal reception circuit according to claim 1, wherein:
    the output terminal is connected to a gate terminal of a semiconductor switch;
    the output reference terminal is connected to a source terminal of the semiconductor switch;
    when the first positive-voltage pulse is output from the output terminal, an on voltage is applied to the gate terminal of the semiconductor switch, the on voltage having positive polarity with respect to the source terminal of the semiconductor switch; and
    when the second positive-voltage pulse is output from the output reference terminal, an off voltage is applied to the gate terminal of the semiconductor switch, the off voltage having negative polarity with respect to the source terminal of the semiconductor switch.

5. The radio-frequency signal reception circuit according to claim 2, wherein:
    the transistor is turned on while the second detector circuit outputs the second reference voltage to the output reference terminal; and
    the transistor is turned off while the second detector circuit outputs the second positive voltage to the output reference terminal.

6. The radio-frequency signal reception circuit according to claim 1, wherein the transistor is a normally-on transistor.

7. The radio-frequency signal reception circuit according to claim 1, wherein:
    the first detector circuit rectifies the first input signal to generate the first output signal; and
    the second detector circuit rectifies the second input signal to generate the second output signal.

8. The radio-frequency signal reception circuit according to claim 1, wherein:
    the first detector circuit includes
    a first coupling capacitor, one end of which is connected to the first input terminal,
    a first diode, a cathode of which is connected to another end of the first coupling capacitor and an anode of which is connected to the input reference terminal,
    a first inductor, one end of which is connected to the another end of the first coupling capacitor, and
    a first smoothing capacitor connected between another end of the first inductor and the input reference terminal; and
    the second detector circuit includes
    a second coupling capacitor, one end of which is connected to the second input terminal,
    a second diode, a cathode of which is connected to another end of the second coupling capacitor and an anode of which is connected to the input reference terminal,
    a second inductor, one end of which is connected to the another end of the second coupling capacitor, and
    a second smoothing capacitor connected between another end of the second inductor and the input reference terminal.

9. An isolated signal transmission apparatus comprising:
    an oscillator that generates a radio-frequency wave;
    a modulator that modulates the radio-frequency wave with a pulse signal to generate the first modulated radio-frequency signal and the second modulated radio-frequency signal, the first modulated radio-frequency signal indicating a first amplitude and a second amplitude smaller than the first amplitude, the second modulated radio-frequency signal indicating a third amplitude and a fourth amplitude smaller than the third amplitude;
- a first electromagnetic resonant coupler that isolatedly transmits the first modulated radio-frequency signal;
- a second electromagnetic resonant coupler that isolatedly transmits the second modulated radio-frequency signal; and
- a radio-frequency signal reception circuit that includes
  - a first input terminal into which a first input signal is input, the first input signal including the first modulated radio-frequency signal;
  - a second input terminal into which a second input signal is input, the second input signal including the second modulated high frequency signal;
  - an input reference terminal to which a reference potential of the first and second input signals is applied;
  - an output terminal from which a first output signal is output;
  - an output reference terminal from which a second output signal is output;
  - a first detector circuit that detects the first input signal and outputs the first output signal to the output terminal, the first output signal including a first positive-voltage pulse based on the reference potential;
  - a second detector circuit that detects the second input signal and outputs the second output signal to the output reference terminal, the second output signal including a second positive-voltage pulse based on the reference potential; and
  - a transistor that includes a first terminal, a second terminal, and a control terminal, the first terminal and control terminal being connected to the input reference terminal, the second terminal being connected to the output reference terminal.

\* \* \* \* \*